United States Patent
Guccione et al.

(10) Patent No.: US 6,922,665 B1
(45) Date of Patent: Jul. 26, 2005

(54) METHOD AND SYSTEM FOR DEVICE-LEVEL SIMULATION OF A CIRCUIT DESIGN FOR A PROGRAMMABLE LOGIC DEVICE

(75) Inventors: Steven A. Guccione, Austin, TX (US); Scott P. McMillan, Santa Clara, CA (US); Brandon J. Blodget, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 818 days.

(21) Appl. No.: 09/757,404

(22) Filed: Jan. 8, 2001

(51) Int. Cl.[7] .............................................. G06F 17/50
(52) U.S. Cl. ......................... 703/14; 716/4; 716/17
(58) Field of Search ........................... 703/14, 17, 20; 716/11, 16

(56) References Cited

U.S. PATENT DOCUMENTS

| | | | |
|---|---|---|---|
| 5,841,967 A | * 11/1998 | Sample et al. | 714/33 |
| 6,216,257 B1 | * 4/2001 | Agrawal et al. | 716/16 |
| 6,324,678 B1 | * 11/2001 | Dangelo et al. | 716/18 |
| 6,466,898 B1 | * 10/2002 | Chan | 703/17 |
| 6,631,508 B1 | * 10/2003 | Williams | 716/8 |
| 6,678,645 B1 | * 1/2004 | Rajsuman et al. | 703/20 |
| 6,691,301 B2 | * 2/2004 | Bowen | 717/114 |

OTHER PUBLICATIONS

Bauer et al, "A Reconfigurable Logic Machine for Fast Event–Driven Simulation", Design Automation Conference Proceedings (DAC), Jun., 1998, pp. 668–671.*

* cited by examiner

*Primary Examiner*—Kevin J. Teska
*Assistant Examiner*—Mary C. Hogan
(74) *Attorney, Agent, or Firm*—LeRoy D. Maunu (57) ABSTRACT

A method and system for simulating a circuit design for a programmable logic device (PLD) at the device level. The same configuration data that is used to configure a PLD is used to generate objects that represent configurable logic elements of the PLD. During simulation, events are generated based on changes in output signal states of the objects. Each event includes an input signal state and identifies an object to which the input signal is to be applied. Since configurable logic elements are simulated, for example, lookup tables, instead of logic gates, fewer events need to be generated and processed than in a conventional simulator. In another embodiment, the system supports an interface that allows tools to interface with the simulator in the same manner as the tools interface with a PLD.

20 Claims, 5 Drawing Sheets

METHOD AND SYSTEM FOR DEVICE-LEVEL SIMULATION OF A CIRCUIT DESIGN FOR A PROGRAMMABLE LOGIC DEVICE

GOVERNMENT CONTRACT

The U.S. Government has a paid-up license in this invention and the right in limited circumstances to require the patent owner to license others on reasonable terms as provided for by the terms of DABT63-99-3-0004 awarded by DARPA.

FIELD OF THE INVENTION

The present invention generally relates to circuit simulation, and more particularly to simulating a circuit at the programmable logic device level.

BACKGROUND

Usage of programmable logic devices (PLDs), in particular, field programmable gate arrays (FPGAs), is expanding from implementation of static circuit designs to in-system, runtime reconfiguration applications. For runtime reconfiguration applications to proliferate, designers must have access to tools that support the development of such applications. For example, JBits software from Xilinx provides an environment for designing and deploying applications that support runtime reconfiguration.

A full complement of tools in a development environment includes a simulator for simulating operation of the circuit on a computer. While there are many simulators available for simulating a static circuit design, the simulators are generally unsuitable for simulating a runtime reconfigurable design. Since simulators are built to simulate static circuit designs, runtime changes to a design (such as those that occur in a runtime reconfigurable design) cannot be simulated.

A system and method that address the aforementioned problems, as well as other related problems, are therefore desirable.

SUMMARY OF THE INVENTION

In various embodiments, a method and system are provided for simulating a circuit design for a programmable logic device (PLD) at the device level. The same configuration data that is used to configure a PLD is used to generate objects that represent configurable logic elements of the PLD. During simulation, events are generated based on changes in output signal states of the objects. Each event includes an input signal state and identifies an object to which the input signal is to be applied. Events are processed by updating attributes of the objects. If an event causes a change in the output signal state of an object ("current objects"), the configurable logic elements that are connected ("output-connected") to the configurable logic element of the current object are identified, and events are generated for each of the objects associated with the output-connected configurable logic elements.

Since configurable logic elements are simulated, for example, lookup tables, instead of logic gates, fewer events need to be generated and processed than in a conventional simulator. In another embodiment, the system supports an interface that allows tools to interface with the simulator in the same manner as the tools interface with a PLD.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Various embodiments of the present invention are described with reference to FPGAs and tools for developing runtime reconfiguration applications, such as JBits. Those skilled in the art will appreciate that the invention could be used to simulate static circuit designs in addition to runtime reconfigurable designs, and that the invention in other embodiments would be suitable for simulating circuit designs for PLDs other than FPGAS.

Figure 1:
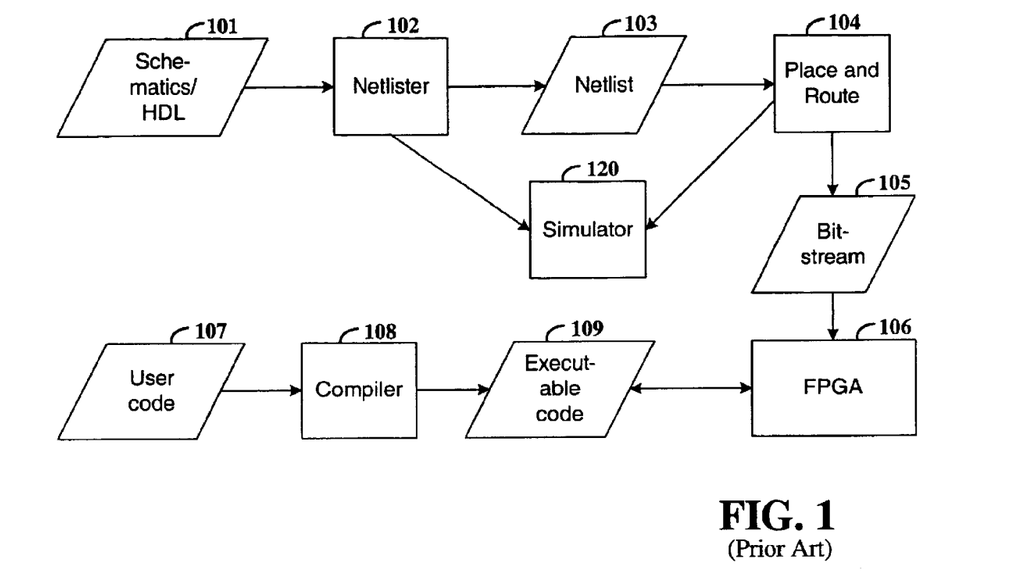
FIG. 1 is a functional block diagram that illustrates the functional relationship between a simulator and other tools in a conventional circuit design path.

Design of a static circuit implemented in an FPGA which interfaces with a reconfigurable logic coprocessor currently requires a combination of two distinct design paths, as shown in FIG. 1. The first and perhaps most significant portion of the effort involves circuit design using traditional CAD tools. The design path for these CAD tools typically comprises entering a design 101 using a schematic editor or hardware description language (HDL), using a netlister 102 to generate a netlist 103 for the design, importing the netlist into an FPGA placement and routing tool 104, which finally generates a bitstream file 105 of configuration data used to configure the FPGA 106.

Once the configuration data has been produced, the next task is to provide software to interface the processor to the FPGA. The user enters user code 107, which is then compiled using compiler 108 to produce executable code 109. The instructions in executable code 109 are then used by the processor to communicate with the configured FPGA 106. It is also known to use executable code 109 to control the configuration of FPGA 106 with bitstream file 105. This series of tasks is usually completely decoupled from the task of designing the circuit and hence can be difficult and error-prone.

In addition to the problems of interfacing the hardware and software in this environment, there is also the problem of design cycle time. Any change to the circuit design requires a complete pass through the hardware design tool chain (101–106 in FIG. 1). This process time is time consuming, with the place and route portion of the chain typically taking several hours to complete.

Finally, this approach provides no support for runtime reconfiguration. The traditional hardware design tools provide support almost exclusively for static design. It is difficult to imagine constructs to support runtime reconfiguration in environments based on schematic or HDL design entry.

Simulator 120 is conventional software that simulates operation of a circuit based on a static design set forth in HDL 101. The simulator is coupled to the netlister and place and route software. It will be appreciated that the simulation performed by simulator 120 occurs prior to generation of bitstream 105. Thus, if errors are introduced in generating the bitstream, these errors may go undetected by the simulator. In addition, since the design embodied in HDL 101 is static and simulator 120 is designed for simulation of static circuits, simulation of runtime reconfigurable circuits is not supported.

Figure 2:
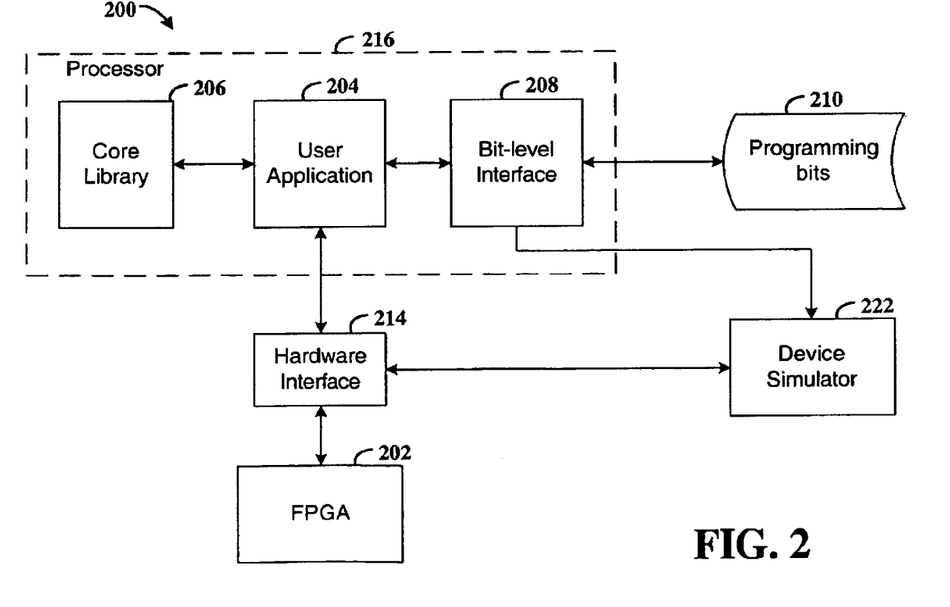
FIG. 2 is a functional block diagram that illustrates a device simulator in combination with an environment for runtime reconfigurable PLD circuit designs.

FIG. 2 is a functional block diagram of a system 200 that illustrates a device simulator in combination with an environment for runtime reconfigurable PLD circuit designs. System 200 includes a user application program 204 that is written in the Java® language, for example. The application program 204 may be written to perform various functions relative to the environment in which system 200 is used. For example, in addition to configuration and/or runtime reconfiguration of FPGA 202, the user application program 204 may be programmed to provide user-interface functions and/or digital signal processing.

Core library 206 is a collection of macrocell or "core" generators that are implemented as Java classes. The cores are generally parameterizable and relocatable within a device. Examples of cores include counters, adders, multipliers, constant adders, constant multipliers, flip-flops and other standard logic and computation functions.

Bit-level interface 208 includes an application program interface that allows the user application program 204 to as manipulate configurable resources of FPGA 202. The bit-level interface also includes a set of functions, one or more of which are invoked when the user application program 204 references the application program interface. The set of functions in the bit-level interface manipulate selected ones of programming bits 210, based on the type of FPGA. JBits software from Xilinx is an example development/execution environment. While core library 206, user application 204, and bit-level interface 208 are written in Java in the example embodiment, it will be appreciated that many other languages would also be suitable.

The programming bits are stored in storage element 212. Storage element 212 may be magnetic, optical, electronic, or a suitable combination thereof that is readable and writable. To configure FPGA 202, user application 204 uses selected ones of bit-level interface routines 208 to read the programming bits 210 and generate a configuration bitstream. In conjunction therewith, selected routines of the hardware interface 214 are invoked to load the configuration bitstream into the FPGA 202.

Hardware interface 214 includes a portable layer of software and accompanying hardware to couple application program 204 to FPGA 202. For example, hardware interface 214 may be the Xilinx Hardware Interface (XHWIF) which is available from XILINX.

Processor 216 is coupled to FPGA 202 via hardware interface 214. The functional requirements of system 200 dictate the particular style and capabilities of processor 216. For example, some applications may call for a RISC based processor while others may call for a CISC. Various ones of special purpose or general purpose processors from manufacturers such as Intel, Sun Microsystems, Motorola, IBM, AMD and others may be suitable.

Device simulator 222 simulates operation of the circuit defined by programming bits 210 as implemented on FPGA 202. The device simulator is coupled to bit-level interface 208 and to the hardware interface 214. Since the device simulator performs the simulation based on the programming bits 210 and uses the same hardware interface 214 as does FPGA 202, simulation of runtime reconfigurable applications is supported. In addition, device simulator can be implemented in a tool-independent manner. That is, since the device simulator has access to a configuration bitstream, the device simulator can operate independent of the tools used to create the configuration bitstream. Depending on implementation requirements, device simulator 222 may be hosted on the same processor as user application 204 and bit-level interface 208 or on a separate processor.

Since device simulator 222 simulates the configurable logic elements of FPGA 202, an enhanced level of simulation accuracy is provided. Furthermore, configurations that are illegal or would cause damage if tested on FPGA 202 can be tested with device simulator and corrected without causing damage to the hardware.

In one embodiment, device simulator 222 invokes routines of bit-level interface 208 to determine the configuration for configurable logic elements of FPGA 202. It another embodiment, the device simulator reads a configuration bitstream to determine the configuration.

Device simulator 222 includes routines that interface with hardware interface 214. Thus, a user application 204 can be run with either FPGA 202 or with device simulator 222. In addition, other tools can be used to interface with the device simulator. For example, the BoardScope debug tool from Xilinx, which conventionally interfaces with an FPGA via hardware interface 214, can also be used to interface with device simulator 222. Since device simulator 222 implements the device interfaces provided by hardware interface 214, tools such as the BoardScope tool can be used without modification.

Device simulator 222 implements a set of interface routines as specified by the hardware interface. For the XHWIF interface, the following methods are provided by the device simulator:

connect( ) performs a logical link between the user application and the device simulator.

disconnect( ) severs the logical link previously created with a connect( ) call.

isConnected( ) returns status information about the logical link between the user application and the device simulator.

getName( ) returns textual information pertaining to the type of simulator and version information.

getArraySize( ) returns the number of FPGA elements available to the user for processing. In the case of the simulator this is always 1.

getDeviceType( ) returns information pertaining to the type of FPGA elements available.

getPackageType( ) returns information about the FPGA packaging arrangement.

getSystemInfo( ) returns additional system information that is hardware specific. In the case of the device simulator, a null is returned.

reset( ) forces a reset on all devices.

setClockFrequency( ) sets the free running clock frequency.

clockOn( ) puts the clock in free running mode.

clockoff( ) puts the clock in single stepping mode.

clockStep( ) single or multi-steps the clock.

getConfiguration( ) reads data from an FPGA device.

setConfiguration( ) sends data to an FPGA device.

getRAM( ) reads data from an SRAM on a board. The device simulator returns nulls for this call.

setRAM( ) sends data to an SRAM on a board. The device simulator performs no action for this call.

The reset( ), clockStep( ), getconfiguration, and setconfiguration methods are further described below.

A user application (204, FIG. 2) can access the hardware interface routines to interact with device (e.g., FPGA 202) or with a device simulator. In one embodiment, the user application provides to the connect routine an input parameter that references either a device or the device simulator. Thus, via startup parameters that are provided as input to the user application, the user application can run in either in a gag simulation mode or with an actual device.

Figure 3A:
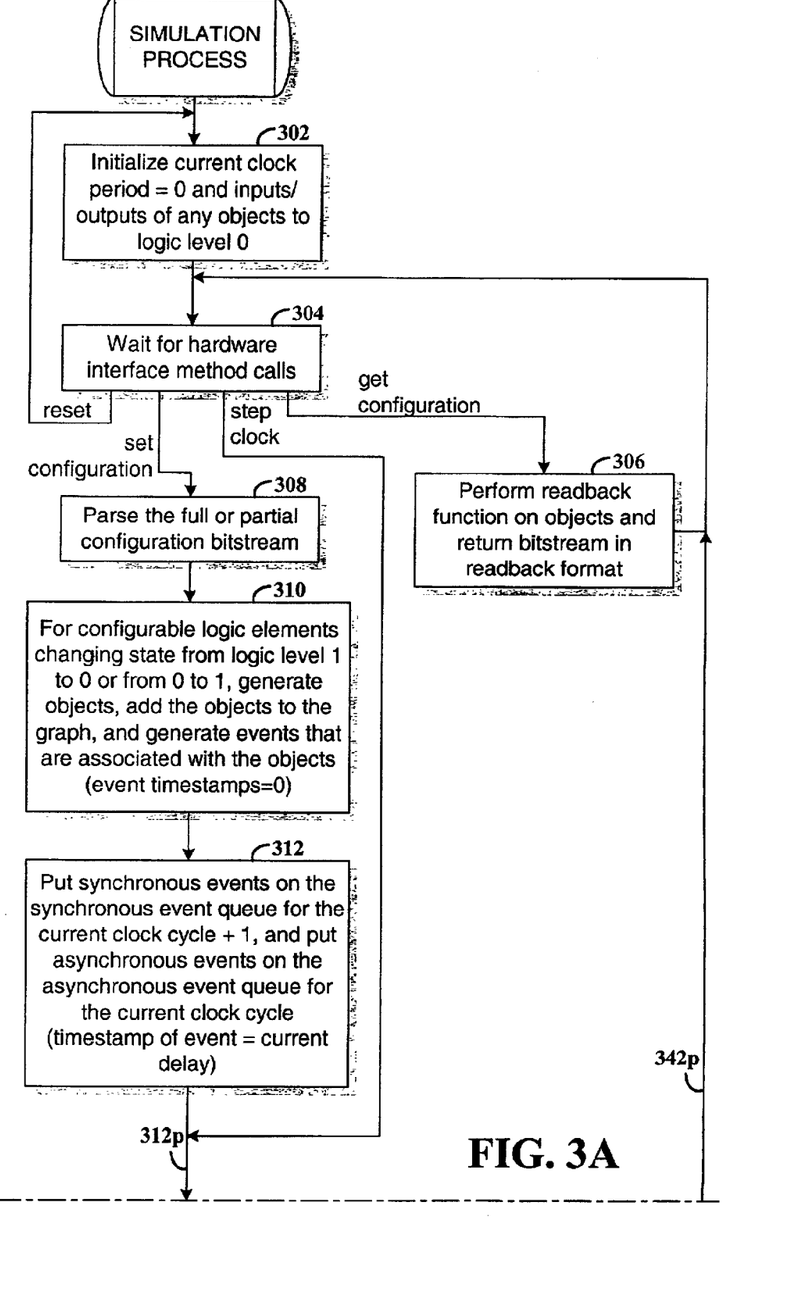
FIGS. 3A and 3B together form a flowchart of a process for performing circuit simulation at the device level in accordance with one embodiment of the invention.
Figure 3B:
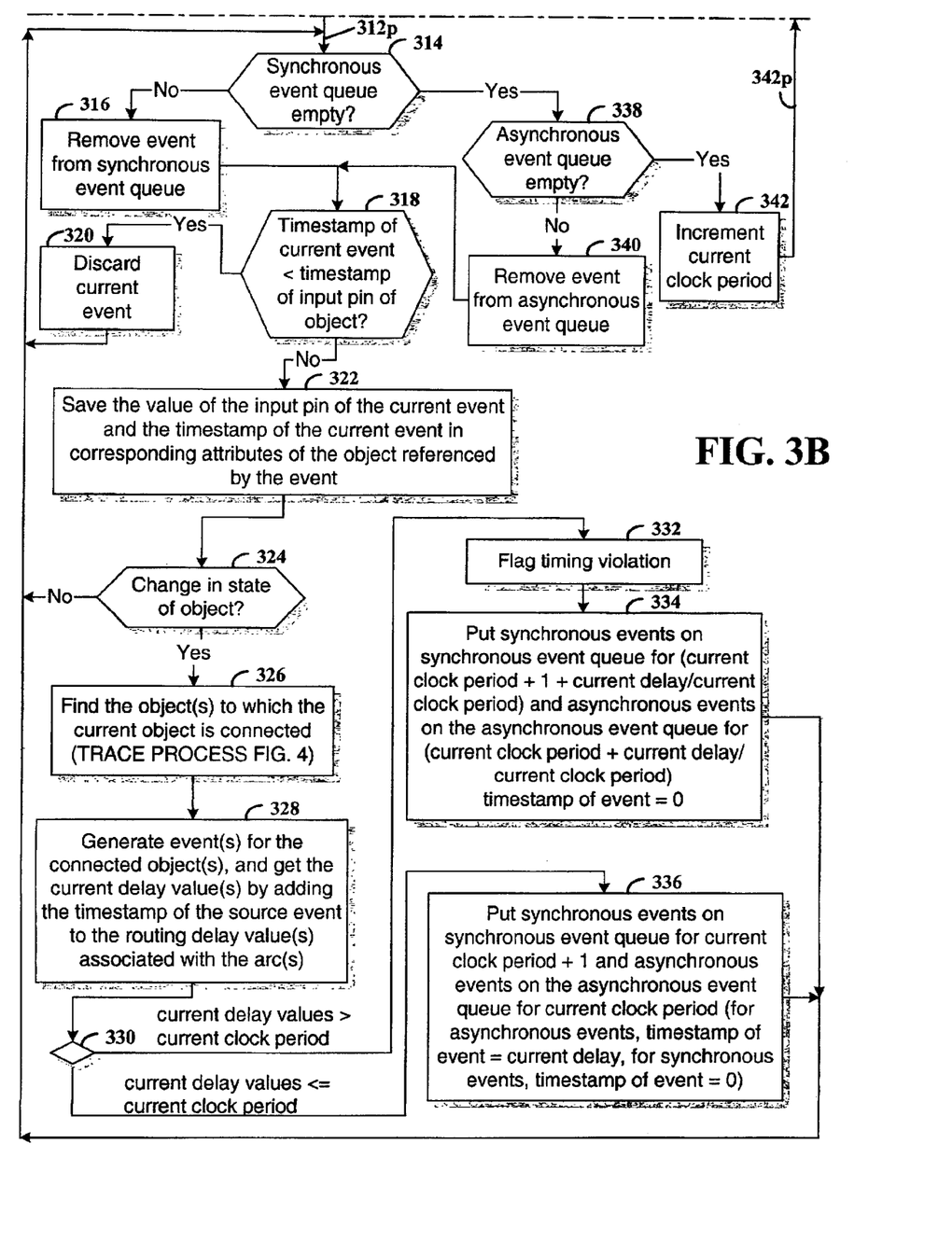

FIGS. 3A and 3B together contain a flowchart of a process for performing circuit simulation at the device level in accordance with one embodiment of the invention. The process generally entails modeling the behavior of configurable elements of a programmable logic device by generating and processing events as set forth in a configuration bitstream.

At step 302, the current clock cycle is initialized to 0 and any objects that were created in prior iterations of the process have the input and output logic levels set to 0. The objects represent configurable elements of the PLD. For example, in an FPGA, the programmable logic elements include flip-flops (FFs) and lookup tables (LUTs). In the example embodiment, an object is instantiated when a change in state of another object is traced as an input signal to the new object.

At step 304, the process waits for a hardware interface method to be called. If the reset method is called, the process returns to step 302 to reset the current clock period and input/output logic levels of the objects. The event queues, which are described below, are also cleared at step 302.

If the getConfiguration( ) method is called, control is directed to step 306 where the readback function for an FPGA, for example, is performed on the objects. The state data of the objects are returned to the hardware interface in the same format as a physical device would provide. Control is then returned to step 302.

If the setConfiguration( ) method is called, the process is directed to step 308. At step 308, the configuration bitstream is parsed to determine which configurable elements of the device are to change state from logic level 0 to 1 or 1 to 0. Selected objects and events are generated at step 310. For a configurable logic element for which an object has not yet been created, the initial logic level is assumed to be 0, and no object or event is generated if the logic level of the in the configuration bitstream of the element is 0 since there is not a change in state. Since objects represent configurable logic elements of a PLD, the term "object" may sometimes be used when referring to a configurable logic element.

Each object includes the following attributes: a logic state value for each input pin of the associated configurable element, and timestamps associated with the input pin attributes. In addition, a LUT object includes a bit-string attribute that is addressable by the combination of logic state values of the input pins, and both LUT and FF objects include a current output state value.

Events are created for each of the objects that undergoes a change in state. In the example embodiment, an event includes five attributes. One attribute is the object with which the event is associated. For example, if the object is a FF, the device-relative identifier of the FF is included in the event. The second attribute identifies an input pin of the object. It will be appreciated that an event for a FF has only one input pin while a LUT has multiple input pins. The third attribute indicates the state of the identified input pin. The fourth attribute is a timestamp that indicates the simulation relative time at which the event was generated. The fifth attribute is a delay value that describes the routing delay.

Routing delay is defined by the worst case time taken for a source state change to reach and affect a corresponding input sink (including fanout). The routing delays are used to determine timing violations and the clock cycle with which to associate the event.

In another embodiment, events also include timing delay values. In performing a simulation, the delay for a given signal can be calculated based on the delays associated with the events that are generated and processed in the simulation.

The bit value in the bit-string attribute as indexed by the logic state values of the input pins provides the current output state of a LUT. Since a LUT may represent a multi-gate function of the high-level design, the device level simulator is more efficient than a gate-level simulator. In other words, instead of simulating multiple gates (requiring multiple events), the device level simulator packs the combined function of multiple gates into a LUT and simulates the LUT (requiring a single event).

Figure 5A:
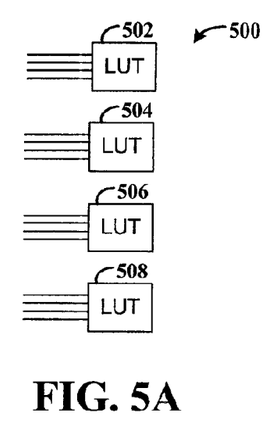
FIGS. 5A–C illustrate the building of a graph that is used in simulation in accordance with the processes of FIGS. 3 and 4.
Figure 5B:
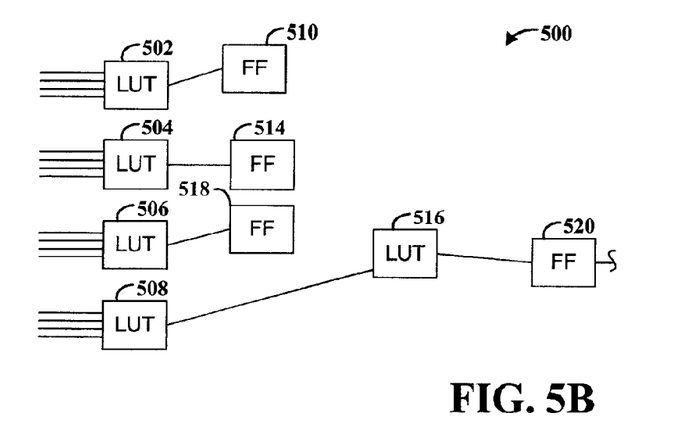

The objects created in step 310 are added as nodes to a graph (e.g., FIGS. 5A–B). Arcs are added to the graph to connect the nodes when events are processed. Each arc represents a source-to-sink coupling of the objects represented by the nodes.

At step 312, the events that were created at step 310 are added either to a synchronous event queue or an asynchronous event queue. A synchronous event is defined as an event generated for an object that will change output state on the next clock edge in response to the input signal of the event. For example, a synchronous event is generated for a data input signal to a FF. An asynchronous event is defined as an event generated for an object that will change output state immediately in response to the input signal of the event. For example, if the output signal of a FF is used to drive the clock-enable signal of another FF, an asynchronous event is generated. LUT input signals are also asynchronous.

An asynchronous and a synchronous queue are maintained for each clock cycle. Whenever an event is generated, the accumulated delay (or timestamp) of the event is checked along with the type of the event. For example, an asynchronous event will be put in the current asynchronous queue as long as its accumulated delay (or timestamp) does not exceed the current clock period. If the accumulated delay exceeds the current clock period, the event is put in the asynchronous queue of the next clock period and a timing violation is flagged. In the case of a synchronous event, if the accumulated delay (or timestamp) for the event is less than the current clock period, the event is put in the synchronous queue of the next clock period (current clock period+1). For example, the event associated with a data input to a flip flop is put on the synchronous queue for the next clock period, since the flip flop will not change state during the current clock period. If the accumulated delay of the synchronous event is greater than the current clock period, the event is put in the synchronous queue of the clock period after the next clock period (current clock period+2), and a timing violation is flagged.

Following-step 312, the process continues at decision step 314 of FIG. 3B, as shown by path 312p.

Events in the synchronous queue of a clock cycle are processed before events in the asynchronous queue of the same clock cycle. Decision step 314 tests whether the synchronous queue of the current clock cycle is empty and directs control to step 316 if there is a synchronous event to process. In one embodiment, the synchronous and asynchronous event queues are maintained is a last-in-first-out (LIFO) order. Maintaining the event queues in this manner eliminates sorting of the events by timestamps and allows the simulation to skip unnecessary processing of earlier events that are intermediate states of a signal.

At step 316, an event is removed from the synchronous event queue, and the process proceeds to decision step 318. Decision step 318 compares the timestamp of the event to the timestamp associated with the input pin of the object. If the timestamp of the event is prior to the timestamp of the input pin of the object, the event can be discarded as shown by step 320. The process then continues at decision step 312 as described above.

If the event cannot be discarded, the process is directed to step 322. At step 322, the value of the input pin from the current event, along with the timestamp of the current event, are used to update the corresponding attributes of the object referenced by the event (e.g., the timestamp of the input pin). In addition, the output state value of the object is updated as a function of the value of the input pin from the event.

The process continues to decision step 324 to test whether the output state value of the object referenced by the event changed in response to the event. If no change in output state occurs, the process returns to decision step 312. Otherwise, the process continues at step 326.

Figure 4:
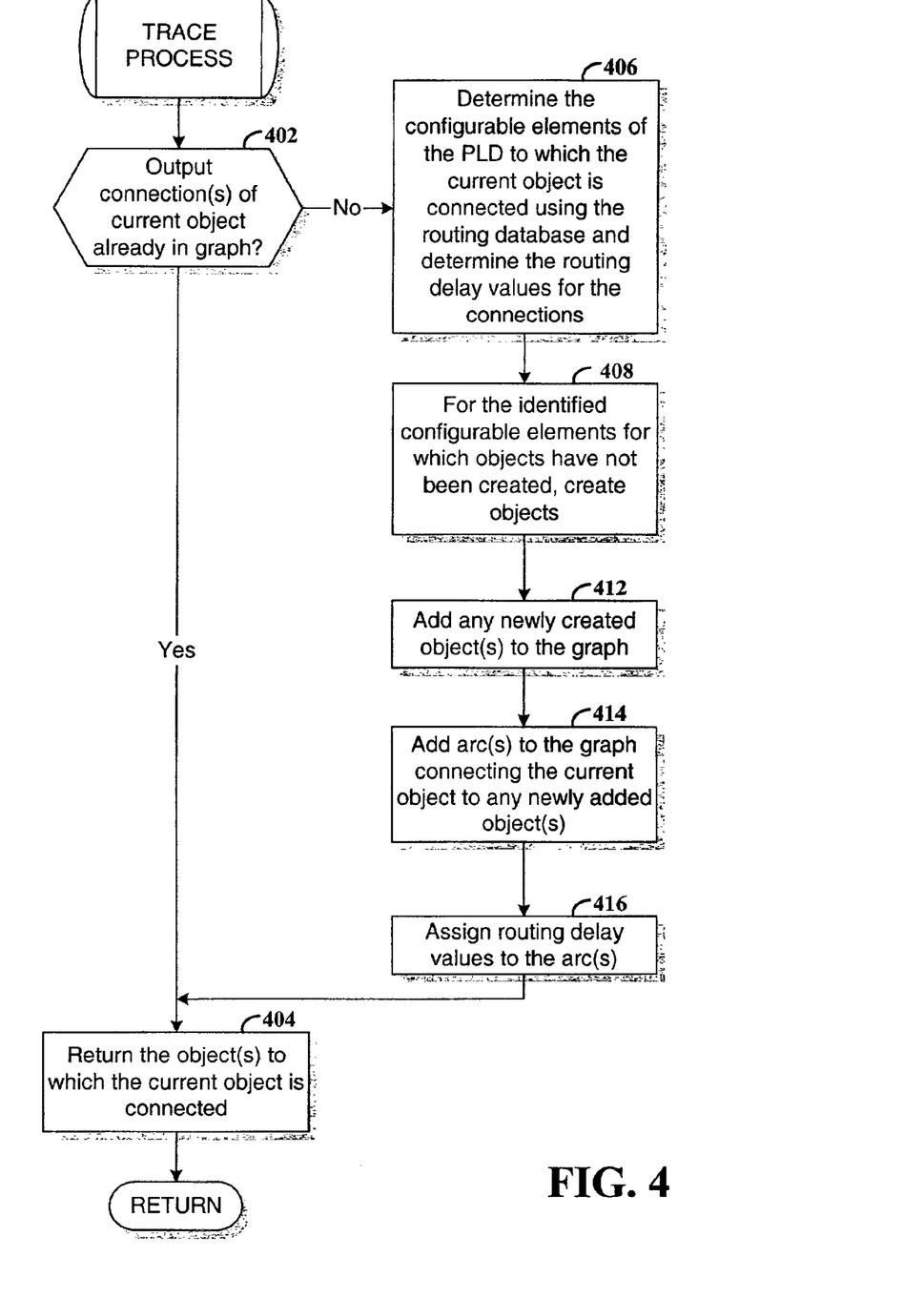
FIG. 4 is a flowchart of a process that determines the configurable elements that are connected to a given configurable element of a PLD.

At step 326, the one or more configurable logic elements that are connected to the output pins of the configurable logic element of the object of the current event ("current object") are identified. FIG. 4 illustrates an example process for tracing the connections.

After the elements are identified, step 328 generates events for each of the objects from step 326 and calculates current delay values for each of the events. The current delay value for an event is the timestamp of the source event (event from step 316) plus the routing delay value assigned to the arc that connects the current object to the object associated with the newly generated event.

Decision step 330 checks for timing violations by the events by comparing the current delay values to the current clock period. For events having current delay values greater than the current clock period, control is directed to step 332 where a timing violation is reported to the user. Where the current delay value is greater than the current clock period, the asynchronous or synchronous event is put on a different clock queue from that required to meet the clock period edge requirements. Thus, at step 334, synchronous events are put on synchronous event queue of the clock period, C1, where C1=current clock period+1+(current delay/current clock period). Asynchronous events are put on the asynchronous event queue of the clock period C2, where C2=current clock period+(current delay/current clock period). The timestamps of the new events are set to 0. The simulation process continues and performs as the hardware would with the event not being processed until a subsequent clock cycle.

For events having current delay values less than or equal to the current clock period, decision step 330 directs control to step 336. At step 336, the synchronous events are put on the synchronous event queue for the clock period C1, where C1=current clock period+1; asynchronous events are put on the asynchronous event queue for the clock period C2, where C2=current clock period. For asynchronous events, the timestamps are set to the current delay value, and for synchronous events, the timestamps are set to 0.

After steps 334 and 336, control is returned to decision step 312. When the synchronous event queue for the current clock period is empty, the process is directed to decision step 338 to check the asynchronous event queue of the current clock period. If there is an asynchronous event, step 340 removes the event from the queue and directs the process to decision step 318 as described above. Once both the synchronous and asynchronous event queues of the current clock period are empty, the process is directed to step 342 where the current clock period is incremented. The process then returns to step 304 of FIG. 3A via path 342p.

FIG. 4 is a flowchart of a process that determines the configurable elements that are connected to a given configurable logic element of a PLD. The process generally entails maintaining a graph where the objects that represent configurable logic elements are nodes in the graphs, and arcs between the nodes represent source-to-sink connections between the objects.

At decision step 402, the process checks the graph to determine whether the current object has output connections to other objects in the graph. If so, the process is directed to step 404, where the one or more objects to which the current object is connected are returned to the simulation process of FIG. 3. Otherwise, the process is directed to step 406.

At step 406, the process determines which configurable elements of the PLD have input pins connected to the output pins of the current object. In one embodiment, the connection information is available in a routing database that is accessible via JRoute routines of the aforementioned JBits software. Those skilled in the art will appreciate that in another embodiment, such as simulating static circuit designs, place-and-route tools can be used to determine the connections between configurable is logic elements.

In the example embodiment, the device simulator inprocessing an event traces connections to configurable logic elements that are connected to the current object, rather than establishing a graph of all objects at initialization. This method spreads the computation cost of tracing all the objects over the entire simulation instead of incurring the entire cost at initialization. In an alternative embodiment, the connections could be traced at initialization.

Step 406 also determines the routing delay values for the connections between the current object and the connected configurable logic elements. The routing delay values are determined by accumulating the delay introduced by the routing resources used by the source to get to the sink, including fanout. The resistance and capacitance effects of each routing resources are also calculated and incorporated into the routing delay values.

At step 408, objects are created for any configurable elements that were identified in step 406 and that do not have a corresponding object. At step 412, the newly created objects are added to the graph, and at step 414 arcs are added to the graph to connect the current object to the newly created objects. The routing delay values from step 406 are assigned to the arcs at step 416 to represent the delay associated with the connections. The process then proceeds to step 404 as described above.

Figure 5C:
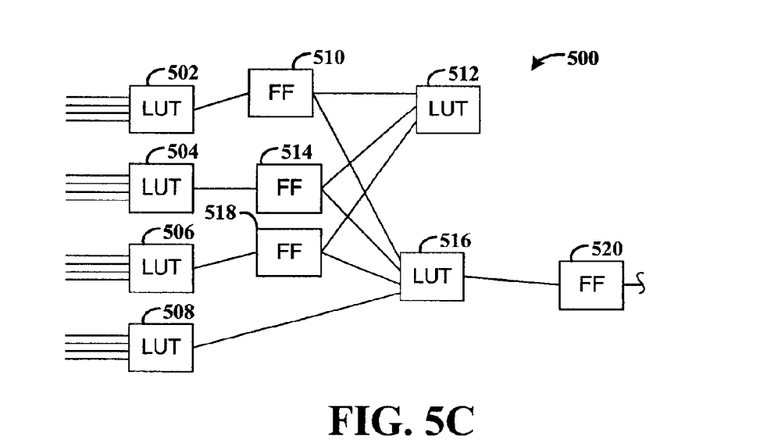

FIGS. 5A–C illustrate the building of a graph that is used in simulation in accordance with the processes of FIGS. 3A–B and 4. FIG. 5A illustrates graph 500 that includes LUTs 502, 504, 506, and 508. Events are associated with the LUTs and are present in the asynchronous event queue (not shown) for the current clock period. Assuming that there are no events in the synchronous queue for the current clock period, the event associated with LUT 502 is processed first. If the LUT 502 event causes LUT 502 to change state, FF 510 (FIG. 5B) is identified as being connected to LUT 502, and a synchronous event is generated for FF 510. The event for FF 510 is assigned a current delay value=timestamp of event for LUT 502 plus the routing delay value assigned to the arc that connects LUT 502 to FF 510. Assuming this current delay value is less than the current clock period, an event is generated for FF 510 and put in the synchronous queue for the current clock period+1.

Since there are still no synchronous events for the current clock period, the next asynchronous event for the current clock period is processed. The LUT 504 event is processed in a manner similar to the processing of the LUT 502 event as described above. An object is created for LUT 514 (FIG. 5B) and a synchronous event for FF 514 is put in the synchronous queue for the current clock period+1. An asynchronous event for LUT 506 is processed in a comparable manner, with an object generated for FF 518 and an event for FF 518 put in the synchronous queue of the current clock period+1.

The asynchronous event for LUT 508 is processed next, resulting in an asynchronous event for LUT 516. If the new current delay value is less than the current clock period, the event for LUT 516 is put in the asynchronous queue of the current clock period. Since the event for LUT 516 is now on the asynchronous queue of the current clock period, the LUT 516 is processed next. Assuming the LUT 516 event causes LUT 516 to change state, FF 520 is identified as being connected to LUT 516, a synchronous event is generated for FF 520, and a current delay value is calculated for the FF 520 event. Assuming that the current delay value is less than the current clock period, the FF 520 event is put in the synchronous queue for the next clock period (current clock period+1).

With the event queues of current clock period now empty, the current clock period is incremented to the next clock period. At this juncture, graph 500 of FIG. 5B illustrates the current objects, and the current clock period has 4 events on the synchronous queue and a events on the asynchronous queue. The process continues when a clockStep( ) method is called from the hardware interface.

The first event processed from the synchronous event queue is the FF 520 event; Events are generated as described above for objects (not shown) that are connected to the output pin of FF 520. The FF 518 event is processed next, resulting in a change in the output state. This causes events to be generated for LUTs 512 and 516 (FIG. 5C). The timestamps for the synchronous events are reset to 0. Thus, the new current delay values are equal to the routing delay values of each of the arcs from FF 518 to LUTs 512 and 516. If there are no timing violations, the two events are put in the asynchronous queue of the current clock period. The process then continues under the control of the called hardware interface methods.

The present invention is believed to be applicable to a variety of environments for simulation of designs for PLDs and has been found to be particularly applicable and beneficial in simulating runtime reconfigurable PLD circuit designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for simulating a circuit design for a programmable logic device (PLD), the PLD including two or more types of configurable elements, comprising:
   (a) reading a configuration bitstream;
   (b) constructing objects in a computer memory, each object corresponding to a configurable element of the PLD as configured in the configuration bitstream, and each object having associated therewith an output signal state and one or more input signal states;
   (c) generating events in response to signal values in the configuration bitstream, each event including an object identifier, an input signal identifier, and an input signal state;
   (d) for each event, updating the output signal state and an input signal state of a corresponding object in response to the input signal state of the event and type of configurable element;
   (e) performing steps (f)–(g) if processing an event changes the output signal state of an object;
   (f) finding the configurable elements that are connected to the output signal; and
   (g) generating events for the objects corresponding to the configurable elements from step (f).

2. The method of claim 1, wherein the PLD is a field programmable gate array (FPGA), and further comprising:
   constructing lookup table objects corresponding to FPGA lookup tables, wherein each lookup table object includes a plurality of input signal attributes and an ordered set of bit values, each bit value addressable by values of the input signal attributes.

3. The method of claim 1, wherein each event further includes a routing delay value.

4. The method of claim 1, further comprising:
   adding each event to a last-in-first-out (LIFO queue; and
   getting each event from the LIFO queue prior to processing the event.

5. The method of claim 4, further comprising maintaining a synchronous event LIFO queue for synchronous events and an asynchronous event LIFO queue for asynchronous events.

6. The method of claim 5, further comprising:
   maintaining respective synchronous event queues for different clock periods;
   maintaining respective asynchronous event queues for different clock periods; and
   for new events generated in processing a current event, selecting synchronous and asynchronous event queues for the new events as a function of accumulated signal delay values.

7. The method of claim 6, wherein the PLD is a field programmable gate array (FPGA), and further comprising:
   constructing lookup table objects corresponding to FPGA lookup tables, wherein each lookup table object includes a plurality of input signal attributes and an ordered set of bit values, each bit value addressable by values of the input signal attributes.

8. The method of claim 6, wherein each event further includes a routing delay value.

9. The method of claim 4, further comprising selectively discarding events.

10. The method of claim 9, wherein each object further includes one or more timestamps associated with the one or more input signal states, and each event includes a timestamp, the method further comprising:

storing time values as timestamps for input pins of objects, each time value being a function of a time at which an event was processed for an object;

storing time values as timestamps for events when events are generated, each time value for an event being a function of a time at which an event was generated;

discarding an event if the timestamp of the event is less than the timestamp of the input pin of the object.

11. The method of claim 10, wherein the PLD is a field programmable gate array (FPGA), and further comprising:

constructing lookup table objects corresponding to FPGA lookup tables, wherein each lookup table object includes a plurality of input signal attributes and an ordered set of bit values, each bit value addressable by values of the input signal attributes.

12. The method of claim 10, wherein each event further includes a routing delay value.

13. The method of claim 1, further comprising, in finding the configurable elements that are connected to the output signal as an event is processed, generating objects corresponding to the configurable elements.

14. The method of claim 1, further comprising simulating the circuit design in response to hardware interface program calls that are selectable for interfacing with a physical device or with a simulation process.

15. The method of claim 14, wherein the PLD is a field programmable gate array (FPGA), and further comprising:

constructing lookup table objects corresponding to FPGA lookup tables, wherein each lookup table object includes a plurality of input signal attributes and an ordered set of bit values, each bit value addressable by values of the input signal attributes.

16. The method of claim 14, wherein each event further includes a routing delay value.

17. The method of claim 14, further comprising:

adding each event to a last-in-first-out (LIFO) queue; and getting each event from the LIFO queue prior to processing the event.

18. The method of claim 17, further comprising maintaining a synchronous event LIFO queue for synchronous events and an asynchronous event LIFO queue for asynchronous events.

19. The method of claim 18, further comprising:

maintaining respective synchronous event queues for different clock periods;

maintaining respective asynchronous event queues for different clock periods; and for new events generated in processing a current event, selecting synchronous and asynchronous event queues for the new events as a function of accumulated signal delay values.

20. An apparatus for simulating a circuit design for a programmable logic device (PLD), the PLD including two or more types of configurable elements, comprising:

means for reading a configuration bitstream;

means for constructing objects in a computer memory, each object corresponding to a configurable element of the PLD as configured in the configuration bitstream, and each object having associated therewith an output signal state and one or more input signal states;

means for generating events in response to signal values in the configuration bitstream, each event including an object identifier, an input signal identifier, and an input signal state;

means for updating the output signal state and an input signal state of a corresponding object, for each event, in response to the input signal state of the event and type of configurable element;

means for finding the configurable elements that are connected to the output signal if processing an event changes the output signal state of an object;

means for generating events for the objects corresponding to the configurable elements connected to the output signal if processing an event changes the output signal state of an object.

* * * * *